(12) United States Patent
Yagi et al.

(10) Patent No.: US 8,290,555 B2
(45) Date of Patent: Oct. 16, 2012

(54) SUPERCONDUCTING WIRE, SUPERCONDUCTING CONDUCTOR, AND SUPERCONDUCTING CABLE

(75) Inventors: Masashi Yagi, Tokyo (JP); Shinichi Mukoyama, Tokyo (JP); Yuh Shiohara, Tokyo (JP); Teruo Izumi, Tokyo (JP); Naoyuki Amemiya, Kyoto (JP)

(73) Assignees: The Furukawa Electric Co., Ltd., Tokyo (JP); International Superconductivity Technology Center, the Juridical Foundation, Tokyo (JP); National University Corporation Yokohama National University, Yokohama-shi (JP)

( * ) Notice: Subject to any disclaimer, the term of this patent is extended or adjusted under 35 U.S.C. 154(b) by 820 days.

(21) Appl. No.: 12/358,916

(22) Filed: Jan. 23, 2009

(65) Prior Publication Data
US 2009/0221427 A1 Sep. 3, 2009

Related U.S. Application Data

(63) Continuation-in-part of application No. PCT/JP2007/063602, filed on Jul. 6, 2007.

(30) Foreign Application Priority Data

Jul. 24, 2006 (JP) ................................. 2006-201155
Jan. 23, 2008 (JP) ................................. 2008-012803

(51) Int. Cl.
*H01B 12/00* (2006.01)
*H01B 12/06* (2006.01)
*H01B 12/04* (2006.01)

(52) U.S. Cl. ........ 505/230; 505/231; 505/236; 505/238; 505/704; 174/125.1; 29/599

(58) Field of Classification Search ................. 505/150, 505/230–233, 237–238, 470; 428/701–702, 428/930; 174/125.1; 29/599
See application file for complete search history.

(56) References Cited

U.S. PATENT DOCUMENTS

| | | | |
|---|---|---|---|
| 5,239,157 A | 8/1993 | Sakano et al. | |
| 5,347,242 A | 9/1994 | Shimano et al. | |
| 6,337,307 B1 | 1/2002 | Nakahara et al. | |
| 6,417,458 B1 | 7/2002 | Mukoyama et al. | |
| 7,301,323 B2 | 11/2007 | Ichikawa et al. | |
| 2004/0266628 A1* | 12/2004 | Lee et al. | 505/238 |
| 2006/0077025 A1* | 4/2006 | Funaki et al. | 335/216 |
| 2008/0202127 A1 | 8/2008 | Mukoyama et al. | |

FOREIGN PATENT DOCUMENTS

JP 05-151837 * 6/1993
(Continued)

OTHER PUBLICATIONS

U.S. Appl. No. 12/364,332, filed Feb. 2, 2009, Yagi, et al.

*Primary Examiner* — Stanley Silverman
*Assistant Examiner* — Kallambella Vijayakumar
(74) *Attorney, Agent, or Firm* — Oblon, Spivak, McClelland, Maier & Neustadt, L.L.P.

(57) ABSTRACT

A superconducting wire having at least a superconducting thin film and a stabilizing film formed one on top of another in order on a substrate having a predetermined width and a predetermined length, the superconducting wire having at least one cut made along a direction of the length of the superconducting wire, the superconducting wire being bendable at the cut in a width direction.

15 Claims, 9 Drawing Sheets

FOREIGN PATENT DOCUMENTS

| | | | |
|---|---|---|---|
| JP | 5-151837 | | 6/1993 |
| JP | 7-73757 | | 3/1995 |
| JP | 07-073757 | * | 3/1995 |
| JP | 09-190727 | * | 7/1997 |
| JP | 9-190727 | | 7/1997 |
| JP | 2000-106043 | | 4/2000 |
| WO | WO 2005008687 | * | 1/2005 |

* cited by examiner

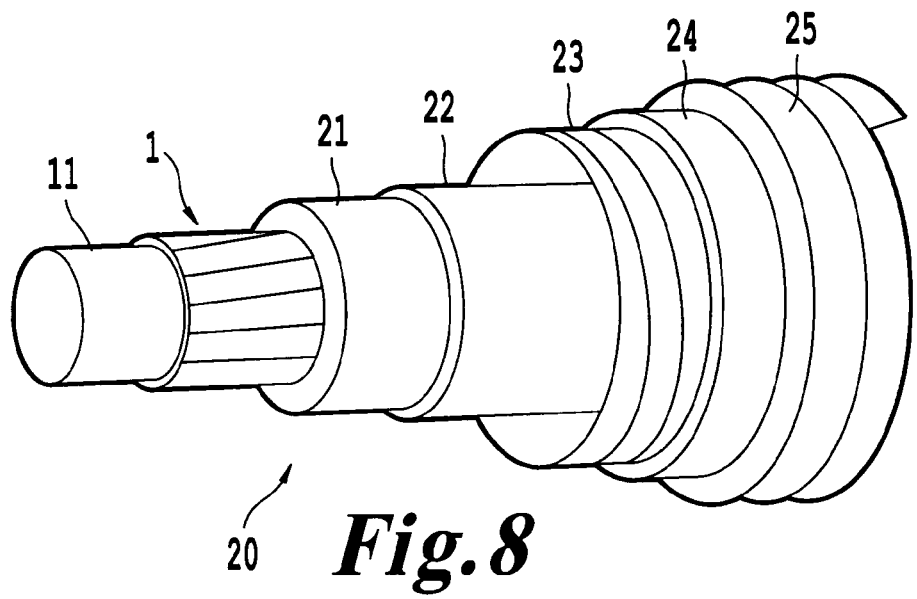
Fig. 8
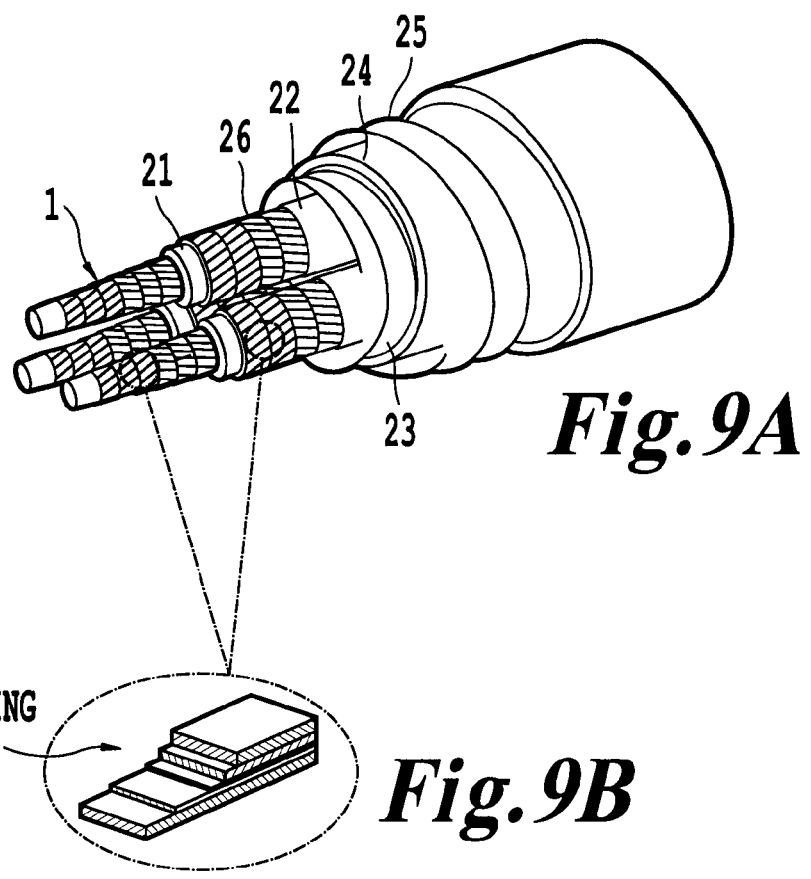
Fig. 9A
Fig. 9B

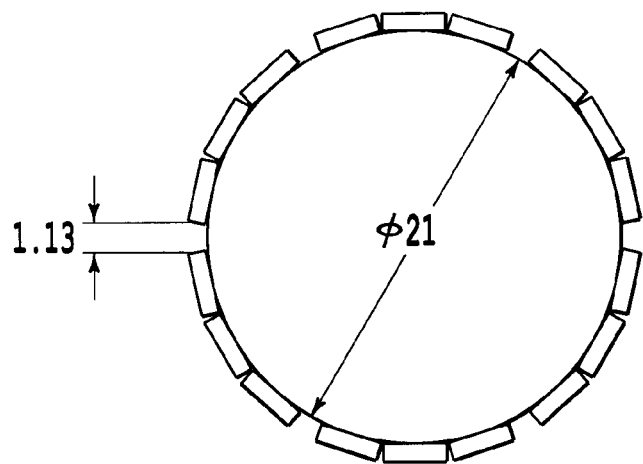
*Fig. 15*
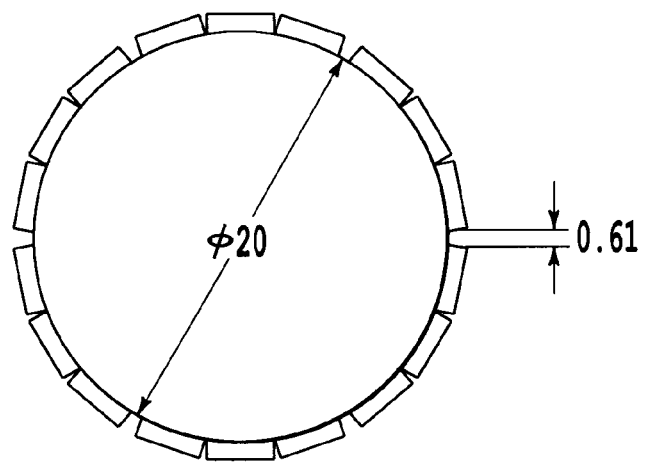
*Fig. 16*
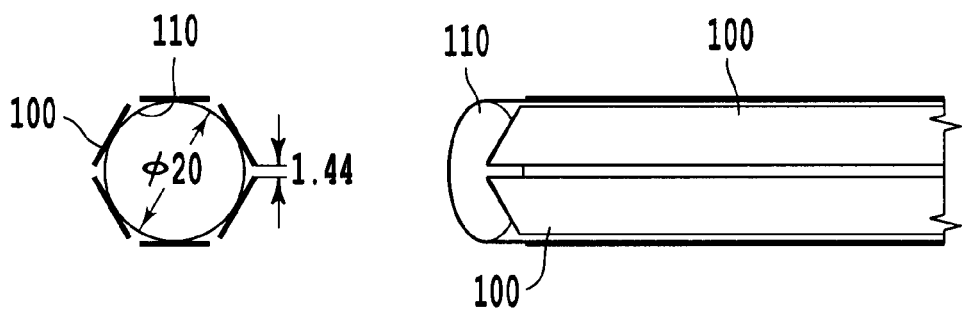
*Fig. 19A*     *Fig. 19B*

SUPERCONDUCTING WIRE, SUPERCONDUCTING CONDUCTOR, AND SUPERCONDUCTING CABLE

TECHNICAL FIELD

The present invention relates to superconducting wires, superconducting conductors, and superconducting cables, and more particularly to a processed superconducting wire with low alternating-current loss, a superconducting conductor, and a superconducting cable.

BACKGROUND ART

In general, as a wire for a high-temperature superconducting cable, a Bi (bismuth)-based silver-sheathed superconducting wire and an Y (yttrium)-based thin-film superconducting wire are known. The problem with the Bi-based silver-sheathed superconducting wire is that the critical current density is sharply decreased when an external magnetic field is applied thereto. Patent Document 1 describes that, in a superconducting cable using the Bi-based silver-sheathed superconducting wire, a plurality of tape-shaped Bi-based silver-sheathed superconducting wires having the same section size are wrapped around a cylindrical former in multiple layers in such a way that no circumferential clearance is left between the adjacent superconducting wires in all layers, whereby a magnetic field component applied to a larger-width face of the superconducting wire in a vertical direction is reduced, and thereby reducing degradation of critical current and reducing the alternating-current loss.

On the other hand, the Y-based thin-film superconducting wire is expected to be applied to an alternating-current power apparatus such as a superconducting cable, because it is able to maintain a high current density even in a strong magnetic field. Furthermore, as a result of the Y-based thin-film superconducting wire being formed by evaporating a YBCO thin film onto a metal substrate, it is a thin film and has a high current density, holding greater promise to reduce a loss (alternating-current loss) produced in alternating-current conditions than the Bi-based silver-sheathed superconducting wire on the elemental wire level.

Because of the extreme thinness of its superconducting material, the Y-based thin-film superconducting wire is known to produce almost no alternating-current loss due to a magnetic field component parallel to a larger-width face of a tape wire. Therefore, an ideal superconducting cable using the Y-based thin-film superconducting wire has a structure in which the Y-based thin-film superconducting wires are disposed with no clearance between them, and, in that case, a self-magnetic field exists only in a conductor circumferential component, making it possible to dramatically reduce the alternating-current loss. Ultimately, as shown in FIG. 10, it is preferably circular in cross section (cylindrical). However, with a superconducting elemental wire having an intermediate layer and a superconducting layer formed on a cylindrical base, by a method described in Patent Document 2 in which it is manufactured by disposing a target for each layer on both upper and lower sides of the wire, it is difficult to align a crystal axis direction even when the superconducting layer is formed so as to be circular in cross section as shown in FIG. 10. It has been found out that, to bring it close to this shape, it is simply necessary to shape it into a polygon having as many vertices as possible by making the Y-based thin-film superconducting wire having a finite width thinner.

[Patent Document 1]
  JP-A-9-190727
[Patent Document 2]
  JP-A-2000-106043

DISCLOSURE OF INVENTION

Problem to be Solved by the Invention

However, when this method is applied to actual manufacturing of a superconducting cable, problems arise, such as excessively large manufacturing facilities and difficulty in setting the gap length between the superconducting wires to be uniform at the time of manufacturing. In addition, in an actual superconducting cable, a clearance is inevitably left between the superconducting wires, making it impossible to cancel a vertical magnetic field caused by a self-magnetic field between the adjacent superconducting wires. Moreover, since both the Bi-based silver-sheathed superconducting wire and the Y-based thin-film superconducting wire have limited current capacity flowing through the superconducting wire on the elemental wire level, it is necessary to form an assembled conductor in which a plurality of superconducting wires are bundled together in order to increase current capacity. When the assembled conductor is formed, if the Y-based thin-film superconducting wire is used in an unprocessed form, good characteristics thereof are lost due to a loss attributable to the superconducting wires assembled into a bundle, resulting in a loss, which is equal to that of the Bi-based silver-sheathed superconducting wire. Therefore, manufacturing of a conductor using the Y-based thin-film superconducting wire requires higher manufacturing precision than the Bi-based silver-sheathed superconducting wire.

In addition, it has been found out that, in current carrying characteristics of an RE-based thin-film superconducting wire, a current path flows nonuniformly in a percolation manner when it is significantly affected by a current inhibitor typified by weak link or a crystal defect in the crystal grain boundary. In particular, the presence of an inhibitor in a direction perpendicular to a direction in which current flows unfavorably causes a local voltage to occur and thereby produces a loss.

For this reason, in order to further enhance superconducting properties, it is necessary to avoid performance degradation caused by the inhibitor, which is inevitably included in the present method for manufacturing a thin-film superconducting wire.

An objective of the present invention is to provide a processed superconducting wire with low alternating-current loss, a superconducting conductor, and a superconducting cable.

Means for Solving Problem

The inventor has earnestly studied to solve the conventionally experienced problems described above. As a result, it has been found out that, when a plurality of cuts, which are parallel to each other are made in a superconducting wire along a direction of the long axis thereof, the superconducting wire having at least a superconducting thin film and a stabilizing film formed one on top of another in order on a substrate, so as to make the superconducting wire bendable at the cuts in the width direction along a cylindrical outer circumferential surface, a self-magnetic field has a component only in a direction along the outer circumferential surface, whereby alternating-current loss is dramatically reduced. Furthermore, it has been found out that performance degradation caused by an inhibitor typified by weak link or a crystal defect, which is inevitably generated at the time of manufacturing can be avoided by making a particular cut (that is, the length of an uncut portion, the length of a cut portion, a space between the cuts in the width direction, and the like). That is, it has been found out that, by appropriately setting the size of the cut, a current is made to bifurcate into split flows in front of the inhibitor and the split flows are made to flow into each other after passing the inhibitor, thereby making it possible to avoid performance degradation caused by the inhibitor. The present invention has been made based on the above-described findings.

A first aspect of a superconducting wire of the invention is directed to a superconducting wire having at least a superconducting thin film and a stabilizing film formed one on top of another in order on a substrate having a predetermined width and a predetermined length, the superconducting wire having at least one cut made along a direction of the length of the superconducting wire, the superconducting wire being bendable at the cut in the width direction. As described above, by making one superconducting wire bendable at a cut made therein without completely separating it into pieces, it is possible to dispose the superconducting wire with ease.

Incidentally, although it is necessary to form a superconducting thin film after forming an intermediate layer on the substrate depending on the type of substrate, since the intermediate layer is provided for preventing the composition of the superconducting thin film from deviating from the stoichiometrical composition due to interdiffusion between the substrate and the superconducting thin film, the formation thereof is not always necessary.

A second aspect of a superconducting wire of the invention is directed to a superconducting wire in which the superconducting thin film is formed of an RE-based superconducting material, the cut is formed with a cut portion and an uncut portion, which are periodically formed in the direction of the length, and the cut includes a plurality of cuts made at regular intervals in the width direction so as to be parallel to each other. Here, RE is a rare-earth element, and the RE-based superconducting material is a superconducting material formed of one or two or more elements selected from Y, Nd, Sm, Eu, Gd, Dy, Ho, Er, Tm, Yb, and Lu.

A third aspect of a superconducting wire of the invention is directed to a superconducting wire having an intermediate layer on the substrate, the intermediate layer being formed of an insulator material or a material of high electrical resistance, wherein the cut is made along the direction of the length of the superconducting wire in such a way as to skirt an inhibitor, which is present in the superconducting thin film.

Incidentally, the insulator material or the material of high electrical resistance refers to a material having an electrical resistivity of 106 Ωm or more.

A fourth aspect of a superconducting wire of the invention is directed to a superconducting wire in which the cut portion is cut such that a current flowing through the superconducting thin film bifurcates into split flows in front of the inhibitor, the uncut portion is not cut such that the split flows flow into each other after passing the inhibitor, and the uncut portion and the cut portion are periodically formed in the direction of the length.

A fifth aspect of a superconducting wire of the invention is directed to a superconducting wire in which the cut includes a plurality of cuts made at regular intervals in the width direction in the space of 1 mm or more.

A sixth aspect of a superconducting wire of the invention is directed to a superconducting wire in which the length of the cut portion is in the range of 100 to 200 mm, and the length of the uncut portion is in the range of 1 to 5 mm.

A seventh aspect of a superconducting wire of the invention is directed to a superconducting wire in which, of the plurality of cuts, the uncut portions are formed in such a way as to lie next to each other in the same position in the width direction of the superconducting wire.

An eighth aspect of a superconducting wire of the invention is directed to a superconducting wire in which a good conductor is formed on any one or both of upper and lower faces of the superconducting wire, and the plurality of cuts are made also in the good conductor.

A first aspect of a superconducting conductor of the invention is directed to a superconducting conductor having a conductor structure including:

a cylindrical object; and a superconducting wire having at least a superconducting thin film and a stabilizing film formed one on top of another in order on a substrate having a predetermined width and a predetermined length and having a plurality of cuts, which are parallel to each other and are made along a direction of the length thereof, the superconducting wire being bent at the cuts in the width direction and disposed along the outer circumferential surface of the cylindrical object.

A second aspect of a superconducting conductor of the invention is directed to a superconducting conductor in which the superconducting thin film is formed of an RE-based superconducting material, the cuts are formed with a cut portion and an uncut portion, which are periodically regulated in the direction of the length, and the plurality of cuts are made at regular intervals in the width direction so as to be parallel to each other. Here, the uncut portion refers to a portion in which no cut is made or at least the stabilizing film and the superconducting thin film are cut.

A third aspect of a superconducting conductor of the invention is directed to a superconducting conductor in which the superconducting wire is bent at the cuts in the width direction along the outer circumferential surface of the cylindrical object.

A fourth aspect of a superconducting conductor of the invention is directed to a superconducting conductor in which a good conductor is formed on any one or both of upper and lower faces of the superconducting wire.

A fifth aspect of a superconducting conductor of the invention is directed to a superconducting conductor in which the superconducting wire includes a plurality of superconducting wires, and the plurality of superconducting wires are disposed along the outer circumferential surface of the cylindrical object in the width direction so as to be adjacent to each other with a predetermined space.

A sixth aspect of a superconducting conductor of the invention is directed to a superconducting conductor in which the predetermined space between the superconducting wires is less than 2 mm.

A seventh aspect of a superconducting conductor of the invention is directed to a superconducting conductor including at least one additional superconducting wire between the superconducting wires, the at least one additional superconducting wire being cut.

An eighth aspect of a superconducting conductor of the invention is directed to a superconducting conductor in which the additional superconducting wire has the same superconducting structure as the superconducting wire.

A first aspect of a superconducting cable of the invention is directed to a superconducting cable including an electrical insulator layer, a protective layer, and a heat insulating tube around the superconducting conductor described above.

Effect of the Invention

Since a plurality of cuts, which are parallel to each other are formed in a superconducting wire along a direction of the long axis thereof, the superconducting wire having at least a superconducting thin film and a stabilizing film formed one on top of another in order on a substrate, so as to make the superconducting wire bendable at the cuts in the width direction along a cylindrical outer circumferential surface, a self-magnetic field has a component only in a direction along the outer circumferential surface, whereby it is possible to dramatically reduce alternating-current loss. This makes it possible to bring it close to an ideal cable using an RE-based superconducting wire, the cable having a structure in which the RE-based superconducting wires are disposed with no clearance between them.

According to the superconducting wire, the superconducting conductor, and the superconducting cable of the invention, by processing the superconducting wire, it is possible to prevent the manufacturing facilities from becoming excessively large, determine the gap length with ease, and obtain the effects similar to those obtained by shaping it in the form of lots of narrow superconductive wires.

According to the invention, since a plurality of cuts, which are parallel to each other and have a particular size (the length of a cut portion, the length of an uncut portion, and a space between the cuts in the width direction) are made in the superconducting wire along a direction of the length thereof, a current flowing through the superconducting wire bifurcates into split flows along the two sides of an inhibitor portion via the uncut portion of the cut in such a way as to go around an inhibitor, which is inevitably generated at the time of manufacturing, making it possible to practically avoid a reduction in Ic (critical current).

BRIEF DESCRIPTION OF DRAWINGS

FIG. 8 is a diagram for explaining a superconducting cable of the invention.

FIG. 9 is a diagram of an example of a structure of a superconducting cable (three-phase) of the invention.

FIG. 15 is a sectional view of Model 3, that is, in which superconducting wires having cuts are disposed on the outer circumferential surface of a cylindrical object which is having a diameter of 21 mm along the long axis, and are disposed at regular intervals.

FIG. 16 is a sectional view of Model 4, that is, in which superconducting wires having cuts made therein are disposed on the outer circumferential surface of a cylindrical object having a diameter of 20 mm along the long axis thereof at regular intervals.

FIG. 19 is a diagram for explaining a case in which a conventional superconducting wire is used.

Figure 1:
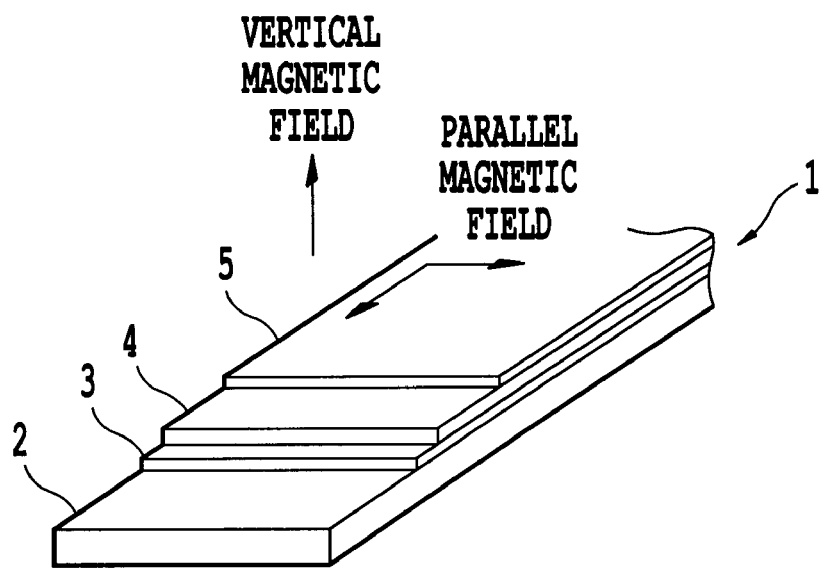
FIG. 1 is a diagram for explaining a superconducting wire of the invention.

EXPLANATIONS OF LETTERS OR NUMERALS 1 superconducting wire (whose cuts are not shown) of the invention
2 substrate
3 intermediate layer
4 superconducting thin film
5 stabilizing film
6 cut
7 cut portion
8 uncut portion
9 additional superconducting wire
10 superconducting conductor
11 cylindrical object
20 superconducting cable (in which a predetermined space between the superconducting wires is not shown)
21 electrical insulator layer
22 protective layer
23 inner tube
24 heat insulating material
25 outer tube
26 superconducting shield layer
100 superconducting wire having no cut
101 separated superconducting wire
110 cylindrical object

BEST MODES FOR CARRYING OUT THE INVENTION

Hereinafter, a superconducting wire, a superconducting conductor, and a superconducting cable of the invention will be explained in detail with reference to the drawings.

As mentioned above, an ideal cable using an RE-based superconducting wire has a structure in which the RE-based superconducting wires are disposed with no clearance between them, and ultimately has a cylindrical (circular cross-sectional) shape. It has been found out that, to bring it close to this shape, it is simply necessary to shape it into a polygon having as many vertices as possible by making a superconducting wire having a finite width thinner. However, when this method is applied to actual manufacturing, problems arise, such as the need for facilities to cut the superconducting wire, excessively large manufacturing facilities, and difficulty in setting the gap length to be uniform at the time of manufacturing. On the other hand, although it is preferable that no gap exists to reduce the alternating-current loss, a wire gap is needed during manufacture and at the time of installation and shipment because a superconducting cable is bent at such times, and it is necessary to control the gap length between the wires.

A superconducting wire 1 of the invention is, as shown in FIG. 1, a superconducting wire having an intermediate layer 3, a superconducting thin film 4 (for example, YBCO), a stabilizing film 5 (for example, silver) formed one on top of another in order on a substrate 2 (for example, hastelloy), and, along the direction of the length of the superconducting wire 1 formed in this manner, as shown in FIG. 2, a plurality of cuts 6 parallel to each other are made. Incidentally, in the superconducting wire 1, the intermediate layer 3 may not be needed depending on the type of substrate 2. In addition, though there are not shown in FIG. 1, it is also possible to form a good conductor such as copper on both or any one of the upper and lower faces of the superconducting wire 1.

The cuts 6 are each composed of cut portions 7 and uncut portions 8 and are made in such a way that the cut portions 7 and the uncut portions 8 appear periodically along the direction of the length, and the plurality of cuts 6 are made in the width direction at regular intervals.

The cuts 6 are made by YAG (Yttrium Aluminium Garnet) laser treatment or a rotary knife having an edgeless portion. As the laser, in addition to the YAG laser, a fiber laser, a CO2 laser, or the like, may be used. Incidentally, the laser cut methods include a laser ON/OFF method and a laser high-power/low-power method. In the laser ON/OFF method, the laser enters from the stabilizing film 5 side, and, when it is ON, cuts all of the stabilizing film 5, the superconducting thin film 4, the intermediate layer 3, and the substrate 2, and thereby forms the cut portion 7; when it is OFF, makes no cut 6, and thereby forms the uncut portion 8. In the laser high-power/low-power method, the laser enters from the stabilizing film 5 side, and, when it is in a high-power state, cuts all of the stabilizing film 5, the superconducting film 4, the intermediate layer 3, and the substrate 2; when it is in a low-power state, cuts at least the stabilizing film 5 and the superconducting thin film 4 and leaves at least part of the substrate 2 uncut. The lengths of the cut portion 7 and the uncut portion 8 are, for example, 100 mm and 1 mm, respectively.

Figure 2A:
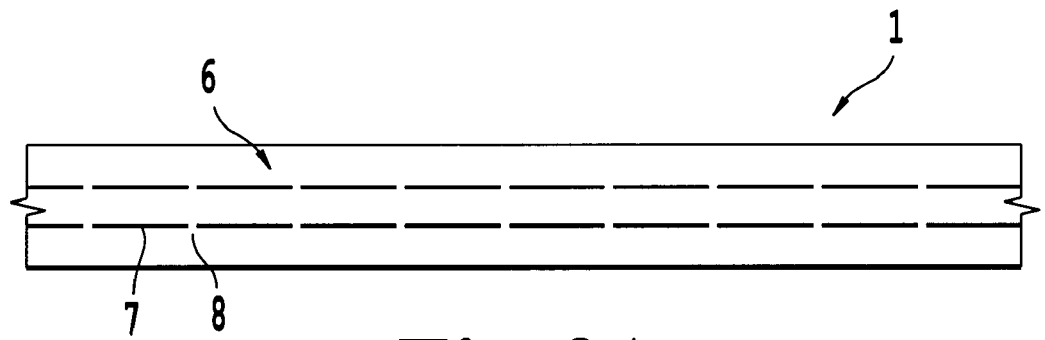
FIG. 2 is a plan view for explaining a superconducting wire of the invention having cuts made therein.
Figure 2B:
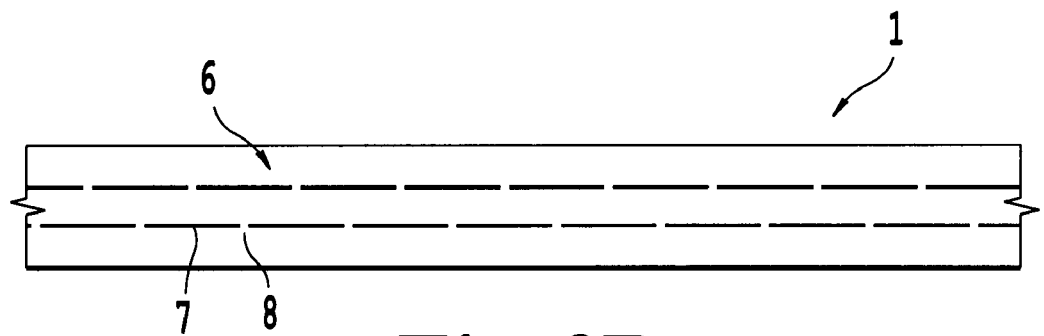

In FIG. 2(a), the cut portions 7 and the uncut portions 8 of two parallel cuts 6 are formed in such a way that they are parallel to their counterparts in like manner; in (b), the cut portions 7 and the uncut portions 8 of two parallel cuts 6 are formed in a staggered format. As shown in FIG. 2(b), the positions of the uncut portions 8 of the plurality of cuts 6 do not always have to be aligned with one another. The cut 6 shown in FIG. 2 is an example, and the cut portion 7 and the uncut portion 8 may be made longer than those shown therein and may be set appropriately depending on the type of substrate 2, or the like; it is also possible to determine the lengths of both the cut portion 7 and the uncut portion 8 based on the probability of occurrence of an inhibitor, which will be explained below. In either case, what is important is that bending in the width direction along the outer circumferential surface of a cylindrical object 11 is made possible by making the cuts 6 in which the cut portions 7 and the uncut portions 8 appear periodically.

How performance degradation caused by an inhibitor typified by a weak link or a crystal defect is avoided by the cut, we will explain the effect of the cut using FIG. 3. The Weak link is generated as a result of the crystal orientations facing in different directions due to the changes the crystals undergo during growth, and the crystal defect is inevitably generated at the time of manufacturing due to a difference in the concentration of a compound, and so on. Incidentally, since the inhibitor inevitably generated at the time of manufacturing is considered to appear with a certain probability (such as once every 1 to 10 m), it is preferable that a cutting length should be basically shorter than a length with a probability of occurrence of an inhibitor.

Figure 3A:
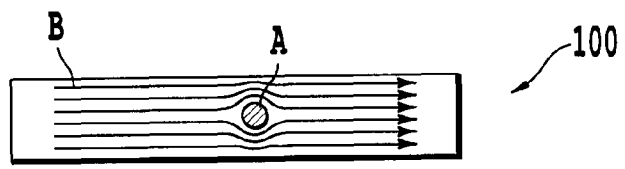
FIG. 3 is a diagram for explaining the effect of the cut on an inhibitor.
Figure 3B:
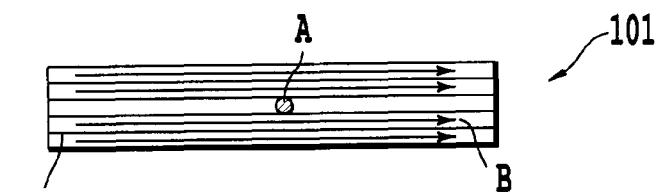
Figure 3C:
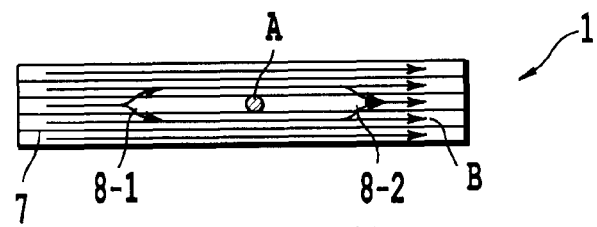

FIG. 3 is a diagram for explaining the effect of the cut on the inhibitor. FIG. 3(a) is a diagram for explaining a flow of current near an inhibitor portion when no cut is made. FIG. 3(b) is a diagram for explaining a flow of current near an inhibitor portion when a cut is made. FIG. 3(c) is a diagram for explaining a flow of current near an inhibitor portion when a specific cut is made. Although an inhibitor A inevitably generated at the time of manufacturing has little impact on the performance as long as it is microscopic, an inhibitor A having a size (diameter) of the order of about 500 μm to 1 mm has an impact on the performance, in particular, an impact in the form of a reduction in Ic (critical current).

As shown in FIG. 3(a), in the case of a superconducting wire 100 having no cut 6 and having no cut made therein, a flow B (a solid arrow) of current in a wide area around the inhibitor A portion is affected, and a current distribution of current is generated in the superconducting thin film. When no cut is made, a reduction in Ic is not observed because the current flows in the superconducting thin film; however, it cannot be bent when wrapped around a cylindrical object. On the other hand, as shown in FIG. 3(b), in the case of a separated superconducting wire 101 in which cuts are simply made such that it is completely separated into five parts in the form of thin lines, although an affected area around the inhibitor A portion becomes narrower, the current flowing through a thin line portion in which the inhibitor A portion lies is affected and stops flowing completely. This causes about 20% of Ic flowing through the entire wire to stop flowing, resulting in performance degradation of the wire as a whole. Incidentally, when it is completely separated into narrow pieces, if the intermediate layer is of a non-insulator type, even when the current stops flowing in the superconducting thin film, the current can be commutated in a thickness direction toward the intermediate layer located below; however, since the intermediate layer of the thin-film superconducting wire is generally an insulator type, complete separation into narrow pieces as shown in FIG. 3(b) induces a reduction in Ic characteristics as described above.

By contrast, as shown in FIG. 3(c), in the superconducting wire 1 of the invention, by defining the length of the cut portion 7, the length of the uncut portion 8, and the width distance between the cuts 6 within a specific range, it is possible to perform control such that, while no current flows through a portion in which the inhibitor A lies, the current bifurcates into split flows at an uncut portion 8-1 located immediately in front of the inhibitor A portion, goes around the inhibitor A, and then the split current flows flow into each other at an uncut portion 8-2 located immediately behind the inhibitor A portion. As a result, it is possible to make the current flowing through the superconducting wire 1 virtually unaffected by the inhibitor A portion, causing almost no reduction in Ic (critical current). Incidentally, when a good conductor is formed in the superconducting wire 1, even when the current flows into the good conductor after going around the inhibitor A portion, if the cut 6 of the invention is not made, the superconducting properties of the superconducting wire 1 are degraded due to the resistance of the good conductor being much higher than that of the superconducting thin film 4.

The size of the cut 6, which makes it possible to perform control so as to generate split flows immediately in front of the inhibitor A portion and make them flow into each other after going around the inhibitor A as described above was studied. The results are shown below.

FIG. 4 is a graph for explaining the effects of the length of the cut portion 7, the length of the uncut portion 8, and the space between the cuts 6 in the width direction on Ic (critical current). Ic (critical current) was measured by using the superconducting wire 1 and varying the length of the cut portion 7, the length of the uncut portion 8, and the space between the cuts 6 in the width direction.

Figure 4A:
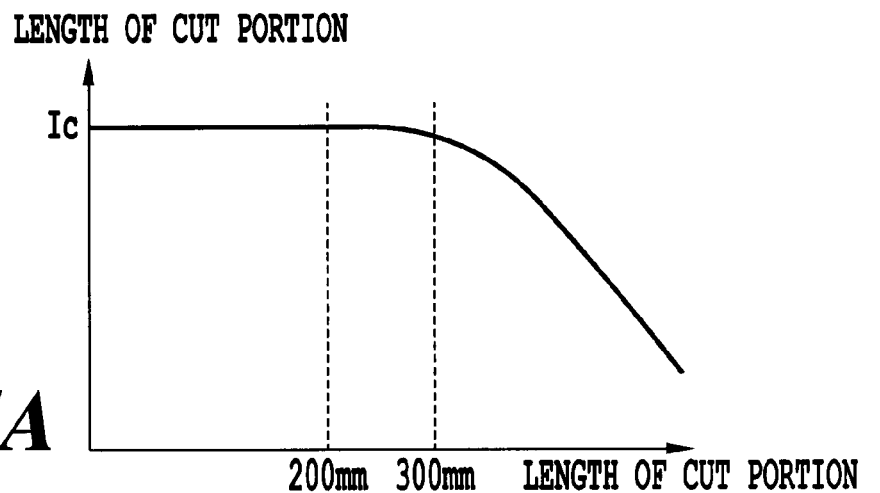
FIG. 4 is a graph for explaining the effects of the length of a cut portion, the length of an uncut portion, and the space between the cuts in the width direction on Ic (critical current).

FIG. 4(a) is a graph of the relationship between the length of the cut portion 7 and Ic (critical current). As shown in FIG. 4(a), when the length of the cut portion 7 exceeds 300 mm, Ic (critical current) decreases sharply. Therefore, the length of the cut portion 7 is 300 mm or less, preferably in the range of 100 to 200 mm (inclusive).

The above-described minimum value of the length of the cut portion 7 has to be set with consideration given to the following factor. That is, when the wire is wrapped around a former, the wire needs to move freely to some extent. When the superconducting conductor is bent, the wire located on the outer side thereof tends to widen; the one located on the inner side thereof tends to narrow. If the length of the cut portion 7 is short, the lateral movement of these wires is limited, causing buckling or excessive elongation in the width direction of a tape and hence degradation of the wire. Therefore, the length of the cut portion 7 is ¼ or more of a spiral pitch, preferably ½ or more thereof; it is preferable that the length thereof be 100 mm or more.

Figure 4B:
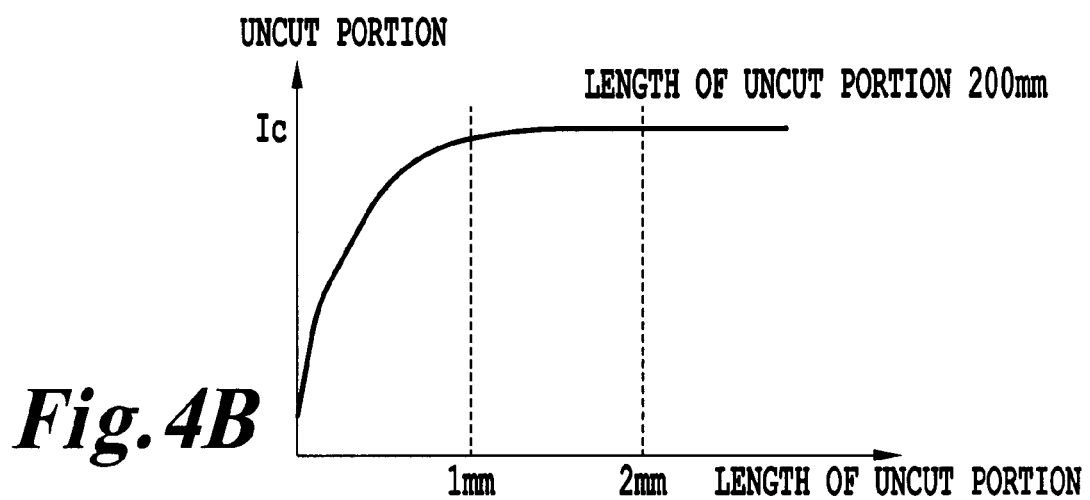

FIG. 4(b) is a graph of the relationship between the length of the uncut portion 8 and Ic (critical current). As shown in FIG. 4(b), when the length of the uncut portion 8 becomes less than 1 mm, Ic (critical current) decreases sharply. Therefore, the length of the uncut portion 8 is 1 mm or more, preferably in the range of 1 to 5 mm (inclusive). Incidentally, when the length thereof is more than 5 mm, at the time of mechanical bending, the uncut portion 8 cannot be bent; if it is forcibly bent, the cut portion 7 located near it will break.

Figure 4C:
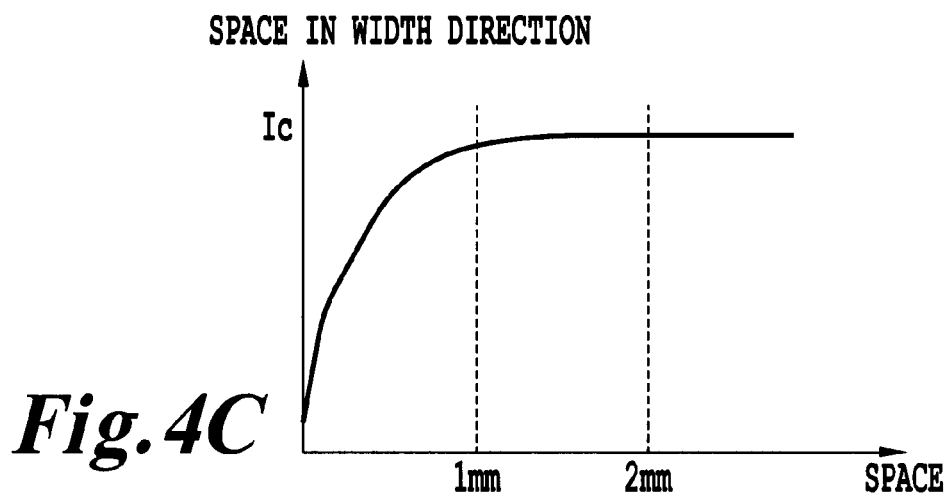

FIG. 4(c) is a graph of the relationship between the space between the cuts 6 in the width direction and Ic (critical current). As shown in FIG. 4(c), when the space between the cuts 6 in the width direction becomes less than 1 mm, Ic (critical current) decreases sharply. Therefore, the space between the cuts 6 in the width direction is 1 mm or more.

Incidentally, by making the cuts 6 as shown in FIG. 2(a) in such a way that the cut portions 7 and the uncut portions 8 of the parallel cuts 6 are parallel to their counterparts in like manner, such that the uncut portions 8 lie next to each other in the same position in the width direction of the superconducting wire 1, split flows are generated uniformly at the uncut portion 8-1 located immediately in front of the inhibitor A portion as described above, equalizing the share of each current path. Therefore, it is preferable to make the cuts 6 as shown in FIG. 2(a).

An aspect of a superconducting conductor 10 of the invention is a superconducting conductor 10 having a conductor structure including a cylindrical object 11 and a superconducting wire 1, which has at least a superconducting thin film 4 and a stabilizing film 5 formed one on top of another in order on a substrate 2 having a predetermined width and a predetermined length, has made therein a plurality of cuts 6 parallel to each other along a direction of the long axis, and is bent at the cuts 6 in the width direction and disposed along the outer circumferential surface of the cylindrical object 11. It includes a plurality of superconducting wires 1, which have the cuts 6 made therein and can be bent in the width direction, and the plurality of superconducting wires 1 are disposed along the outer circumferential surface of the cylindrical object 11 so as to lie next to each other in the width direction with a predetermined space left between them. The predetermined space is also called a gap length between the superconducting wires 1, or to be precise, refers to a distance between the adjacent superconducting thin films 4. Incidentally, the gap length (predetermined space) here is the average value of the space between the superconducting thin films 4.

Figure 5:
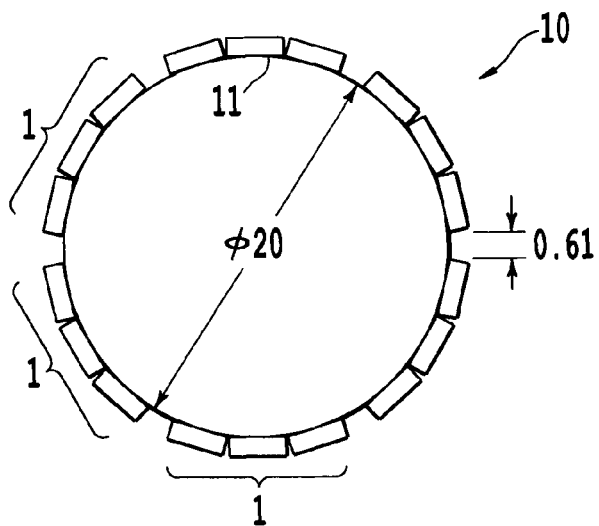
FIG. 5 is a diagram for explaining a section of a superconducting conductor of the invention.
Figure 6:
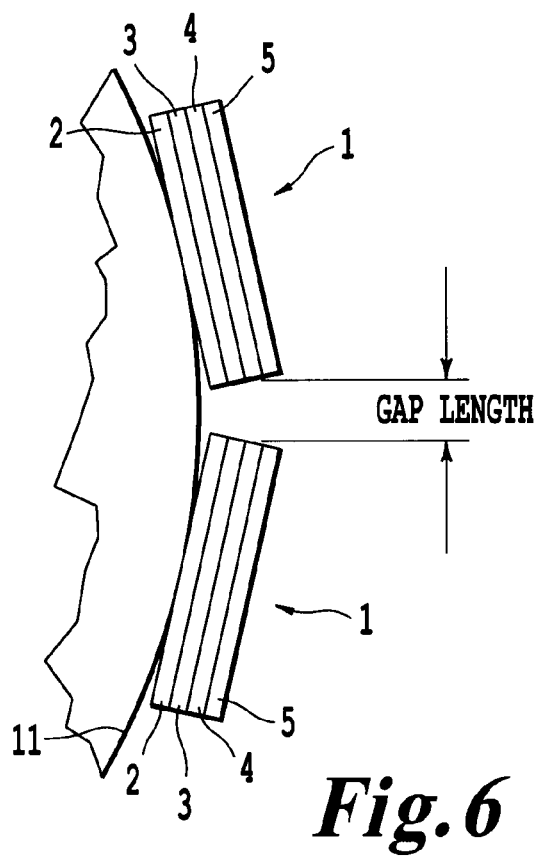
FIG. 6 is a diagram for explaining a predetermined space (gap length) of the invention.

FIG. 5 is a diagram for explaining a section of the superconducting conductor 10 of the invention. As shown in FIG. 5, on the outer circumferential surface of the cylindrical object 11 that is made of copper, which is a good conductor and is 20 mm in diameter, for example, a plurality of (in FIG. 5, six of them, each having a width of 10 mm) superconducting wires 1, which have the cut 6 made therein and are bent in the width direction are disposed on the outer circumferential surface of the cylindrical object 11 along the long axis thereof so as to be parallel to each other at roughly regular intervals. The gap length between the superconducting wires 1 is 0.61 mm. In the description, the gap length (predetermined space) refers to a distance between the superconducting thin films 4 of the adjacent superconducting wires 1 as shown in FIG. 6, and can be controlled by controlling the diameter of the cylindrical object 11, the thickness of the substrate 2 or the intermediate layer 3, and the width of the cut 6. Each superconducting wire 1 has two cuts 6 made therein at regular intervals as shown in FIG. 2. The cuts 6 are each a dashed line-shaped cut 6 in which the cut portions 7 and the uncut portions 8 appear periodically. The superconducting wires 1 having the cuts 6 made therein as described above are disposed on the outer circumferential surface of the cylindrical object 11 so as to be parallel to each other with a gap length of 0.61 mm. The substrate 2 of the bent superconducting wire 1 is disposed with part of the face of the substrate 2 brought into contact with the outer circumferential surface of the cylindrical object 11.

Another aspect of a superconducting conductor 10 of the invention is a superconducting conductor 10 provided with, between the superconducting wires 1, at least one additional superconducting wire 9 shaped in the form of a narrow piece. That is, in order to minimize the predetermined space between the plurality of superconducting wires 1, in addition to the superconducting wires 1 having the cuts 6 made therein, an additional superconducting wire 9, which is shaped in the form of a narrow piece and is to be disposed between the superconducting wires 1 is prepared so as to adjust the gap length between the superconducting wires 1.

Figure 7:
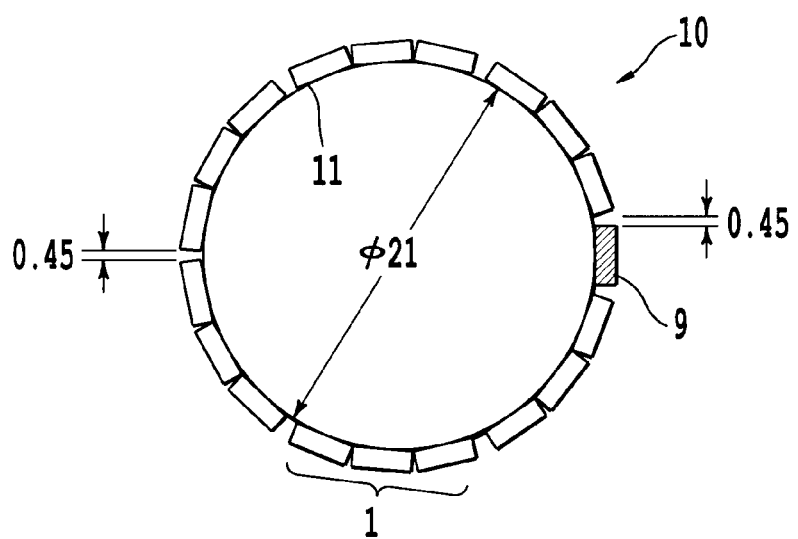
FIG. 7 is a diagram of a section of a superconducting conductor of another aspect of the invention.

FIG. 7 is a diagram of a section of the superconducting conductor 10 of another aspect of the invention. As shown in FIG. 7, on the outer circumferential surface of the cylindrical object 11 that is made of copper, which is a good conductor and is 21 mm in diameter, for example, a plurality of (in FIG. 7, six of them, each having a width of 10 mm) superconducting wires 1, which have the cut 6 made therein and are bent in the width direction are disposed on the outer circumferential surface of the cylindrical object 11 along the long axis thereof so as to be parallel to each other. In this aspect, in order to set the gap length between the superconducting wires 1 at 0.54 mm, an additional superconducting wire 9 shaped in the form of a narrow piece having a width of 3.33 mm is inserted between the superconducting wires 1. Also in this aspect, the superconducting wires 1 each have two cuts 6 made therein at regular intervals as shown in FIG. 2. The cuts 6 are each a dashed line-shaped cut 6 in which the cut portions 7 and the uncut portions 8 appear periodically.

In order to dispose the superconducting wires 1 having the cuts 6 made therein as described above on the outer circumferential surface of the cylindrical object 11 so as to be parallel to each other with a gap length of 0.54 mm, the above-described additional superconducting wire 9 shaped in the form of a narrow piece having a width of 3.33 mm is inserted and placed in a remaining space. Also in this aspect, the substrates 2 of the bent superconducting wires 1 and the additional superconducting wire 9 are disposed with the whole surface thereof brought into contact with the outer circumferential surface of the cylindrical object 11. The above-described additional superconducting wire 9 shaped in the form of a narrow piece has the same superconducting structure as the superconducting wire 1 explained by referring to FIGS. 1 and 2, the superconducting wire 1 having at least the superconducting thin film 4 and the stabilizing film 5 formed one on top of another in order on the substrate 2 and having the cut 6 made therein. As described above, it is possible to make an adjustment so as to obtain a predetermined gap length by using the additional superconducting wire 9 shaped in the form of a narrow piece. The details will be described later by an example.

FIG. 8 is a diagram for explaining a superconducting cable of the invention. A superconducting cable 20 is formed as a cable core formed with the cylindrical object 11, which is made of metal (for example, copper) and wrapped with the superconducting wires 1 in a spiral manner, an electrical insulator layer 21 (made of paper or semisynthetic paper) laid thereon, and a protective layer 22 (for example, made of conductive paper or copper braided wire), the cable core being housed in a double-insulated tube made of flexible metal (for example, made of stainless or aluminium), that is, the doubly-insulated tube formed with an inner tube 23, an outer tube 25, and a heat insulating material 24 placed between the inner tube 23 and the outer tube 25.

FIG. 9 is a diagram of an example of a structure of a superconducting cable (three-phase) of the invention. As shown in FIG. 9, the structure of a superconducting cable 20 is a structure in which a cable core formed with the cylindrical object 11, which is made of metal (for example, copper) and wrapped with the superconducting wires 1 in a spiral manner, an electrical insulator layer 21 (made of paper or semisynthetic paper) laid thereon, a superconducting shield layer 26, and a protective layer 22 (for example, made of conductive paper or copper braided wire) formed thereon is placed in a double-insulated tube made of flexible metal (for example, made of stainless or aluminium). The doubly-insulated tube is formed with an inner tube 23, an outer tube 25, and a heat insulating material 24 placed between the inner tube 23 and the outer tube 25. In addition, outside the double-insulated tube, a PVC protective layer may be further provided. In this case, although the conductor forming the superconducting shield layer 26 is not particularly limited, it is preferable to use a superconducting wire similar to the superconducting wire 1. Although no superconducting shield layer is provided in FIG. 8, it is preferable to provide the superconducting shield layer 26 as in FIG. 9. The presence of the superconducting shield layer 26 makes it possible to form the superconducting cable 20 with an extremely small magnetic leakage field.

Hereinafter, the superconducting wire and the superconducting conductor of the invention will be explained in further detail by an example and a comparative example.

The superconducting wire 1 of the invention, for example, a 10-mm-wide superconducting tape is not completely separated into pieces, but is provided with a cut portion and an uncut portion by making a dashed line-shaped cut therein as shown in FIG. 2. The superconducting wire 1 processed in this manner can be bent in the width direction. The cut 6 can be made by, for example, laser ON/OFF (instead of OFF, lowering the output) or providing part of a rotary knife with an edgeless portion. As described above, since the superconducting wire 1 is not separated into pieces, one feed spool and one take-up spool are all that is needed.

Figure 10:
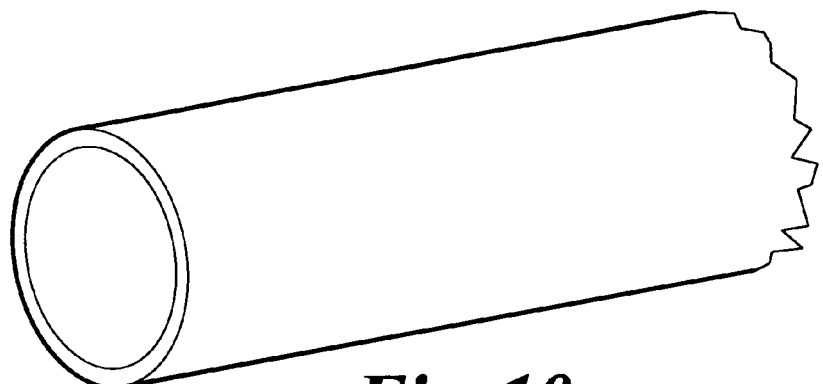
FIG. 10 is a diagram of an ideal Y-based superconductor.

When such superconducting wires 1 are wrapped around the cylindrical object 11 as shown in FIG. 5, a section of the superconducting conductor 10 composed of the cylindrical object 11 and the superconducting wires 1 is nearly circular, making it possible to reduce the effect of a vertical magnetic field of the superconducting wire 1. Here, the shape of an ideal RE-based superconductor is shown in FIG. 10. Incidentally, the alternating-current loss is reduced according to the number of cuts 6 made in one superconducting wire 1. That is, the larger the number of cuts 6 made therein, the lower the alternating-current loss becomes.

In addition, as a cross-section shape of the superconducting conductor 10 approaches a circle, the gap length between the superconducting wires 1 is decreased. When a conventional superconducting wire is used, the gap length between the superconducting wires 100 is 1.44 mm as shown in FIG. 19; when the superconducting wire 1 of the invention having the cut 6 made therein is used, the gap length between the superconducting wires 1 can be reduced to 0.61 mm in FIG. 5. The facilities required for wrapping the superconducting wires 1 around the cylindrical object 11 in the invention are exactly the same as those used for the conventional superconducting wire 100 having no cut 6, and it is also possible to set the gap length between the superconducting wires 1 with ease.

It is preferable that the size of a gap between the superconducting wires 1 be less than 2 mm because a size of less than 2 mm produces the effect of reducing the alternating-current loss. In order to reduce the alternating-current loss, a minimal gap length between the superconducting wires 1 is preferable, and the gap length can be reduced to 0 mm. For example, with a gap length of 0.5 mm, it is possible to reduce the alternating-current loss to about ½ of that observed when the gap length is infinite; with a gap length of 0.1 mm, the alternating-current loss is expected to be reduced to about ¹⁄₁₀ of that observed when the gap length is infinite.

Incidentally, the larger the number of cuts 6 made in the above-described superconducting wire 1 in the width direction, the more effective in reducing the alternating-current loss. In addition to that, by decreasing the gap length between the superconducting wires 1, it is possible to greatly reduce the alternating-current loss by the synergistic effects of the cut 6 and the gap length.

Hereinafter, the effectiveness of the superconducting wire 1 of the invention was confirmed by models produced experimentally and theory.

Figure 11:
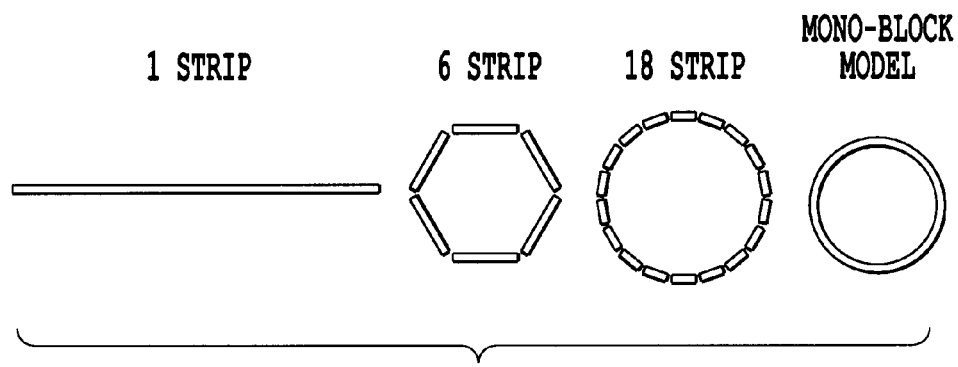
FIG. 11 is a conceptual diagram of models designed by using the Norris strip model as a theoretical model.
Figure 12:
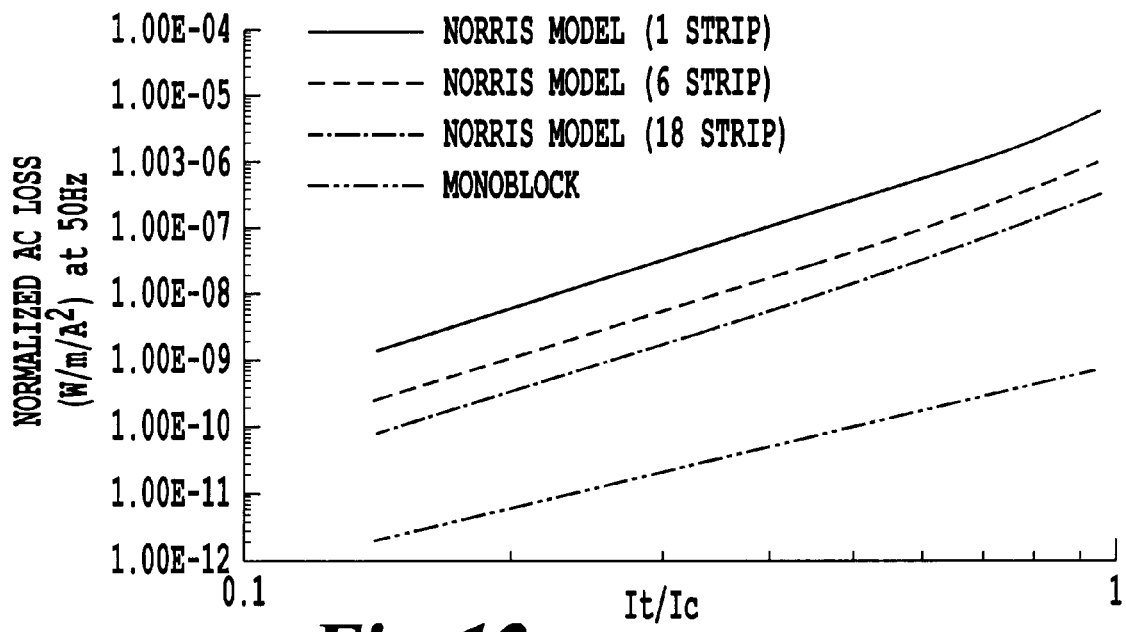
FIG. 12 is a graph of the alternating-current losses of the models.

As a theoretical model, the Norris strip models shown in FIG. 11 were used. Although, in FIG. 11, the gap length of each model is finite, with the Norris strip model, the gap length is mathematically infinite, and the effect of the adjacent superconducting wires is ignored. In FIG. 12, the alternating-current losses of them are shown. In FIG. 12, the vertical axis represents a conduction loss normalized by the square of critical current (Ic), and the horizontal axis represents peak conduction current (It) normalized by critical current (Ic). The horizontal axis and the vertical axis of FIG. 12 are normalized to eliminate the dependence of Ic (critical current). In the horizontal axis, the peak conduction current is divided by Ic; in the vertical axis, division by the square of Ic is performed. This is because the alternating-current loss of the theoretical model is proportional to the square of Ic.

According to FIG. 12, the alternating-current losses of 6-strip and 18-strip are reduced to ⅙ and ¹⁄₁₈, respectively, of that of 1-strip. However, a theoretical formula for an ultimate cylindrical form is given by a mono-block model. Given that there is a superconducting cylindrical model, which is 20 mm in diameter and 1 micrometer in thickness, then the loss is about 1/1000 of that of 6-strip. This discrepancy is due to the gap length between the tapes of the Norris strip model being set to be infinite.

For comparison with the theory described above, models were actually prepared.

By using six 10-mm-wide superconducting wires 1 as the superconducting wire 1, the following Model 1 to Model 5 were prepared. Incidentally, here, Model 1 corresponds to a conventional example, Model 2 corresponds to a comparative example, and Models 3 to 5 correspond to examples of the invention.

Figure 13:
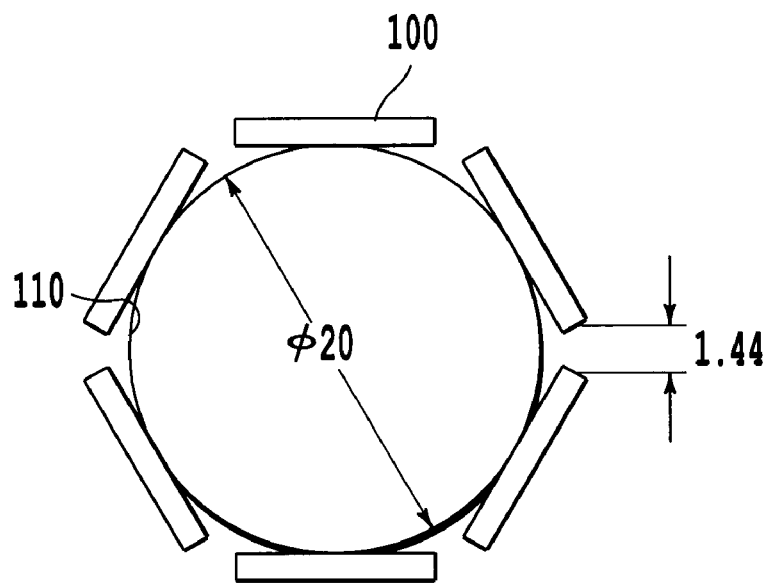
FIG. 13 is a sectional view of Model 1, that is, in which conventional superconducting wires are disposed on the outer circumferential surface of a cylindrical object having a diameter of 20 mm along the long axis thereof at regular intervals.

Model 1 was, as shown in FIG. 13, obtained by disposing the conventional superconducting wires 100 having no cut 6 made therein on the outer circumferential surface of a cylindrical object 110 having a diameter of 20 mm along the long axis thereof at regular intervals. The gap length between the superconducting wires 100 at that point was 1.44 mm.

Figure 14:
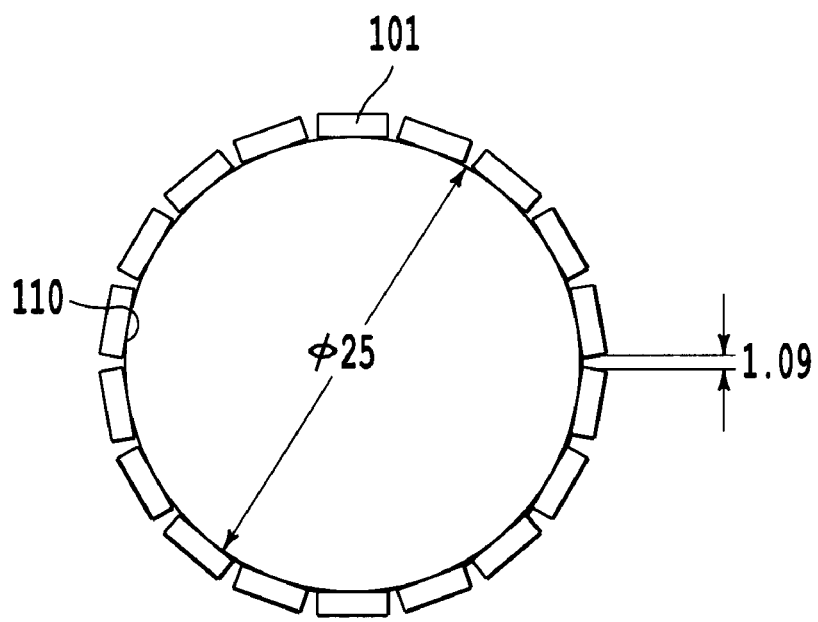
FIG. 14 is a sectional view of Model 2, that is, in which separated superconducting wires are disposed on the outer circumferential surface of a cylindrical object having a diameter of 25 mm along the long axis thereof at regular intervals.

In Model 2, each superconducting wire 100 was completely separated into three pieces by performing laser treatment twice. As a result, a total of 18 separated superconducting wires 101 were obtained. As shown in FIG. 14, these separated superconducting wires 101 were disposed on the outer circumferential surface of a cylindrical object 110 having a diameter of 25 mm along the long axis thereof at regular intervals. At that point, the gap length between the separated superconducting wires 101 was 1.09 mm.

In Model 3, two dashed line-shaped cuts 6 were made in each superconducting wire 1. These cuts 6 were made by using ON/OFF of a YAG laser, such that a cut portion 7 having a length of 100 mm and an uncut portion 8 having a length of 1 mm were formed periodically. The laser diameter at that point was 100 micrometers. The superconducting wires 1 having the cuts 6 composed of the cut portions 7 and the uncut portions 8 as described above were disposed on the outer circumferential surface of a cylindrical object 11 having a diameter of 21 mm along the long axis thereof at regular intervals as shown in FIG. 15. The gap length between the superconducting wires 1 at that point was 1.13 mm.

In Model 4, two dashed line-shaped cuts 6 were made in each superconducting wire 1. The cuts 6 were made in the same manner as in Model 3. The superconducting wires 1 having the cuts 6 made therein as described above were disposed on the outer circumferential surface of a cylindrical object 11 having a diameter of 20 mm along the long axis thereof at regular intervals as shown in FIG. 16. The gap length between the superconducting wires 1 at that point was 0.61 mm.

Figure 17:
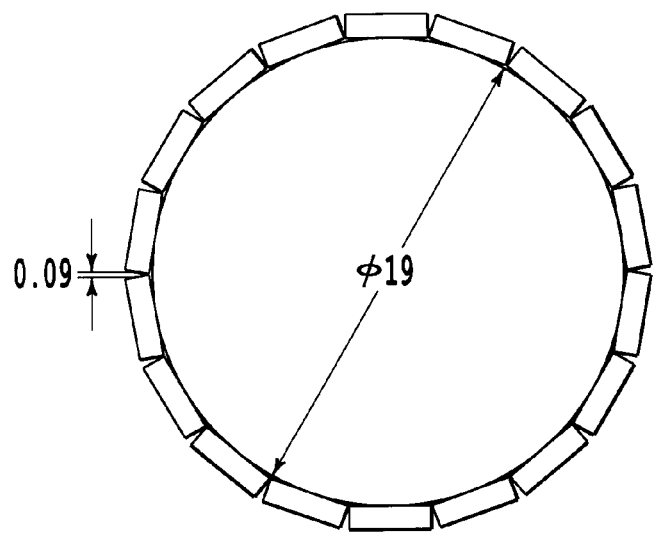
FIG. 17 is a sectional view of Model 5, that is, in which superconducting wires having cuts made therein are disposed on the outer circumferential surface of a cylindrical object having a diameter of 19 mm along the long axis thereof at regular intervals.

In model 5, two dashed line-shaped cuts 6 were made in each superconducting wire 1. The cuts 6 were made in the same manner as in Model 3. The superconducting wires having the cuts 6 made therein as described above were disposed on the outer circumferential surface of a cylindrical object 11 having a diameter of 19 mm along the long axis thereof at regular intervals as shown in FIG. 17. The gap length between the superconducting wires 1 at that point was 0.09 mm.

Figure 18:
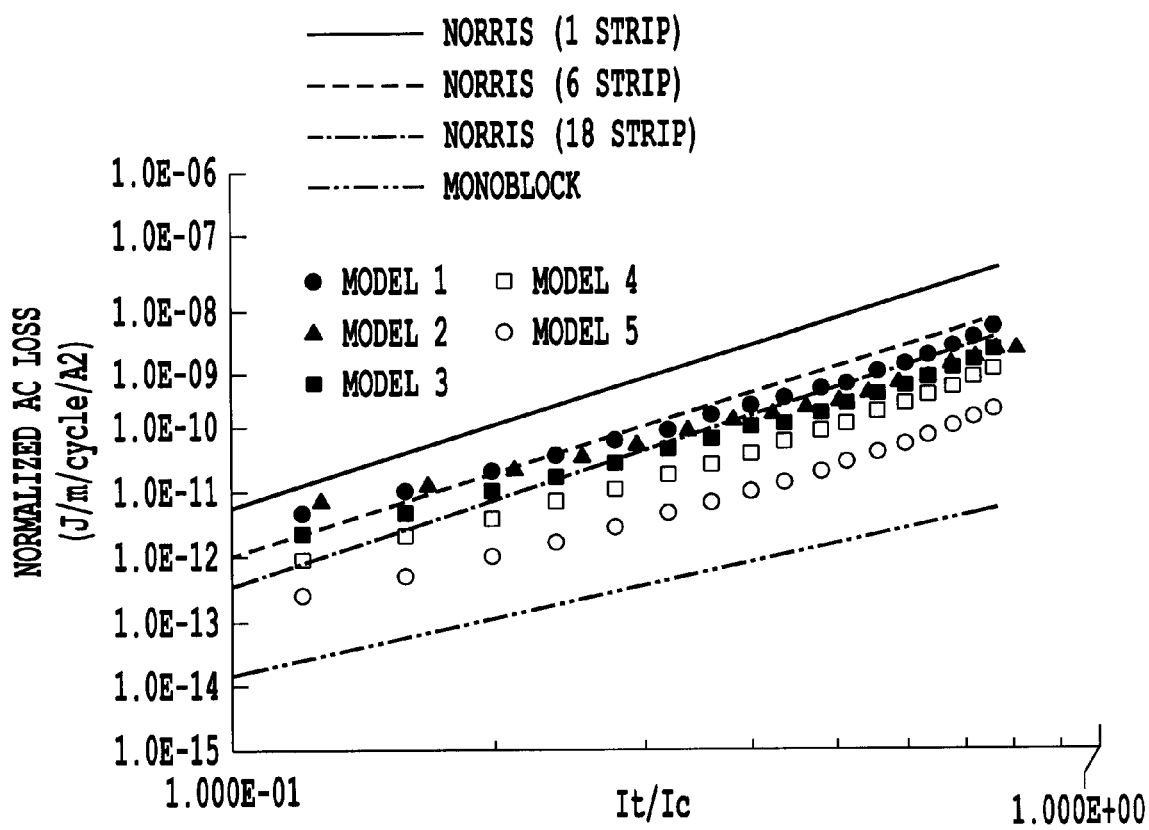
FIG. 18 is a graph of characteristics of Models 1 to 5.

The characteristics of Models 1 to 5 are shown in FIG. 18. In FIG. 18, the vertical axis represents a conduction loss normalized by the square of critical current (Ic), and the horizontal axis represents peak conduction current (It) normalized by critical current (Ic). As it is clear from FIG. 18 that the smaller the gap length of the superconducting wire, the lower the normalized conduction loss. That is, the results of Models 1 to 3 are in good agreement with the partition theoretical model, and, since Models 2 and 3 exhibit substantially the same characteristics, it has been shown that it is possible to obtain the effect similar to that obtained in a case in which a dashed line-shaped cut 6 is made in the superconducting wire and a case in which the superconducting wire is completely separated into pieces. However, in Model 2, due to the superconducting wire being completely separated into 18 pieces (each of which is also called a reel), it is difficult to maintain a uniform gap length between the separated superconducting wires 101.

By contrast, Model 3 uses the superconducting wire 1 having the cut 6 made therein, and therefore the superconducting wire 1 is not completely separated into pieces. As a result, the number of reels is six, which is the same as the original number of superconducting wires, making it easy to adjust the gap length between the superconducting wires 1.

In addition, Models 3, 4, and 5 show the effect of the gap length (that is, the smaller the gap length, the lower the alternating-current loss). In the case of Model 4 having a gap length of 0.61 mm, it is reduced to 2/3 to 1/2 as compared with Model 3 having a gap length of 1.13 mm, and in the case of Model 5 having a gap length of 0.09 mm, it is reduced to 1/5 to 1/10 as compared with Model 3 having a gap length of 1.13 mm. Model 5 is found to have the lowest alternating-current loss.

Furthermore, a method for reducing the alternating-current loss will be explained.

In general, since the width of the superconducting wire has a fixed value (in this case, 10 mm), the gap length (the size of the gap) between the superconducting wires depends on the diameter of the cylindrical object 11 around which the superconducting wires are wrapped. For example, in Model 3 having a gap length of 1.13 mm and Model 4 having a gap length of 0.61 mm, alternating-current losses differ by of the order of 2/3 to 1/2; however, in Model 3, it is impossible to add another superconducting wire, making it impossible to decrease the gap length. Thus, a reduction in alternating-current loss cannot be expected.

In order to increase current capacity, multiple layers of the superconducting wire are laid in a diameter direction, increasing the possibility of frequent variations in a diameter around which the superconducting wires are wrapped as described above. Therefore, in addition to making the cut 6 in the superconducting wire 1, a completely-separate thin-line superconducting wire 9 is previously prepared. This complete separation is easily achieved by laser treatment. For example, when the superconducting wire 1 is separated completely by a laser, three superconducting wires 9 each having a width of 3.33 mm are obtained.

In Model 3, when one superconducting wire 9 having a width of 3.33 mm is added, the gap length between the superconducting wires 1 and between the superconducting wire 1 and the additional superconducting wire 9 becomes 0.54 mm, making it possible to achieve a reduction in alternating-current loss equivalent to that of Model 4 having a gap length of 0.61 mm.

As described above, FIG. 7 is a diagram of a state in which the superconducting wire 9 is inserted between the superconducting wires 1, each being a thin superconducting wire having the cuts 6 made therein. As shown in FIG. 7, between six superconducting wires 1 having the cuts 6 made therein, one additional superconducting wire 9 having a width of 3.33 mm is inserted. The black part shown in FIG. 7 indicates the newly inserted additional superconducting wire 9 having a width of 3.33 mm. By inserting this narrow wire, it is possible to set the gap length between the superconducting wires 1 and 9 at 0.54 mm. As described above, even when the diameter of the cylindrical object 11 around which the superconducting wires are wrapped varies, it is possible to reduce the alternating-current loss by inserting the superconducting wire 9 so as to decrease the gap length between the superconducting wires.

Furthermore, when a conductor is formed by wrapping the superconducting wires in a spiral, the gap length is not easily determined. This is because the number of wires to be wrapped varies depending on the spiral pitch. In general, wrapping them in a spiral in this manner is for the purpose of increasing the mechanical strength thereof during bending or the like. Here, for reference purposes, the relation between gap length and wrapping pitch when, as in Model 2 shown in FIG. 14, separated superconducting wires 101 having a width of 3.33 mm are wrapped around a cylindrical object 110 is shown in Table 1. However, unlike Model 2, the cylindrical object 110 is a 20 mm former. As shown in Table 1, when the spiral pitch is 200 to 300 mm or longer, the number of wires, which can be wrapped becomes equal to that obtained by making the spiral pitch infinite, that is, by not wrapping them in a spiral. Likewise, the gap length becomes equal to that obtained by not wrapping them in a spiral. On the other hand, as the spiral pitch is shortened, the number of wires, which can be wrapped is reduced and the gap length is increased. The same tendency is observed when the superconducting wires 1 of the invention are wrapped around a cylindrical object in a spiral manner in a similar fashion.

TABLE 1

| Former diameter (mm) | 20 | 20 | 20 | 20 | 20 | 20 | 20 |
|---|---|---|---|---|---|---|---|
| Wire width (mm) | 3.33 | 3.33 | 3.33 | 3.33 | 3.33 | 3.33 | 3.33 |
| Spiral pitch (mm) | 100 | 150 | 200 | 300 | 400 | 500 | ∞ |
| Number of wires, which can be wrapped | 15 | 17 | 18 | 18 | 18 | 18 | 18 |
| Gap length (mm) | 1.01 | 0.40 | 0.17 | 0.16 | 0.16 | 0.16 | 0.16 |

However, in order to increase current capacity, the superconducting wires are generally laid so as to form multiple layers (see FIG. 9). Thus, when the superconducting wires are wrapped in a spiral, the spiral pitch is determined by adjusting the inductance of each layer of the superconducting wires. Although the gap length is not uniquely determined by adjusting the inductance, minimizing the gap length is effective in reducing the alternating-current loss.

However, in the superconducting cable in which the separated superconducting wires 101 are used and wrapped in a spiral, if the gap length is minimized, the separated superconducting wires 101 may run into each other, causing deformation in the superconducting wires 101 and causing their loss of superconductivity, or the wires may run into each other and overlap one another as shown in FIG. 14. The use of the superconducting wires 1 of the invention as shown in FIG. 5, however, can prevent a loss of their own superconductivity because, even when the adjacent superconducting wires having the cut portions 7 formed therein run into each other, what actually run into each other are the substrates 2 of the superconducting wires 1, preventing direct deformation of the superconducting thin films 4. In addition, since the superconducting wire 1 of the invention is a wire in an integrated form, there is little likelihood that the superconducting wires overlap one another. However, when the gap length becomes less than 0.09 mm, there is a possibility that the adjacent superconducting wires 1 run into each other when the superconducting wires 1 are wrapped in a spiral manner, causing degradation in superconducting properties. Moreover, as for the gap length, as shown in the examples, with a predetermined spacing from 0.09 to 1.13 mm, it is possible to further reduce the alternating-current loss.

When six wires are wrapped around a conductor (cylindrical object 11) 20 mm in diameter in a spiral at 300 mm pitch as shown in FIG. 16, the gap length is substantially equal to that obtained when they are not wrapped around the cylindrical object 11 in a spiral manner. Even when the bending diameter of the superconducting cable 20 in which the superconducting wires 1 of the invention are wrapped around a conductor (cylindrical object 11) in a spiral as shown in FIG. 8 is set at 1 m, no degradation in critical current is observed. In this way, it was confirmed to have satisfactory performance as a practical superconducting cable.

The above-described processing treatment that makes the cut 6 in the superconducting wire 1 is effective for a thin-film superconducting wire provided with a superconducting thin film 4 having a thickness of 0.1 to 5 μm. It is not effective for a superconducting wire, such as a Bi-based silver-sheathed superconducting wire, having a large number of filaments. The Bi-based silver-sheathed superconducting wire is obtained by the PIT (Powder In Tube) method by putting a plurality of superconducting filaments in a sheathing member and rolling it. Although the superconducting filaments obtained by the PIT method each have a thickness of the order of 10 μm, they are regarded as being virtually integrated into a single piece because they are electromagnetically bonded to one another. As a result, in term of the entire region serving as a superconductor, it has a thickness of the order of 0.1 to 0.2 mm as a superconducting layer, and has a higher alternating-current loss than the thin-film superconducting wire. Thus, even if a cut is made in the Bi-based silver-sheathed superconducting wire as in the invention, this does not contribute to a reduction in the alternating-current loss. In addition, when a cut is made in the Bi-based silver-sheathed superconducting wire, the superconducting filaments laid one on top of another are damaged by the cut, causing a further decrease of Ic.

Likewise, in the case of the Bi-based silver-sheathed superconducting wire, even if the superconducting filament portion has a defect, because of a multilayer-like structure of the filament structure, it is possible to obtain split flows in the thickness direction even when no uncut portion is provided in the cut. This makes it impossible to obtain the effect of avoiding performance degradation in the defect portion by applying the cut of the invention.

It is to be noted that the invention is effectively applied also to a thin film-shaped superconducting wire such as a superconducting wire having an additional good conductor such as copper on both or any one of the upper and lower faces of the superconducting wire.

What is claimed is:

1. A superconducting wire comprising:
a superconducting thin film and a stabilizing film formed one on top of another in order on a substrate having a predetermined width and a predetermined length, wherein,
the superconducting wire having at least one cut made along a direction of a length of the superconducting wire,
the superconducting wire being bendable at the cut in a width direction, and
the cut passes through all of the stabilizing film, the superconducting thin film, and the substrate.

2. The superconducting wire according to claim 1, wherein,
the superconducting thin film is formed of an RE-based superconducting material,
the cut is formed with a cut portion and an uncut portion, which are periodically formed in the direction of the length, and
the cut comprises a plurality of cuts made at regular intervals in the width direction so as to be parallel to each other.

3. The superconducting wire according to claim 1, further comprising:
an intermediate layer on the substrate, the intermediate layer being formed of an insulator material or a material of high electrical resistance,
wherein the cut is made along the direction of the length of the superconducting wire in such a way as to skirt an inhibitor, which is present in the superconducting thin film.

4. The superconducting wire according to claim 1, wherein,
the cut portion is cut such that a current flowing through the superconducting thin film bifurcates into split flows in front of an inhibitor,
an uncut portion is not cut such that the split flows flow into each other after passing the inhibitor, and
the uncut portion and the cut portion are periodically formed in the direction of the length.

5. The superconducting wire according to claim 1, wherein the cut comprises a plurality of cuts made at regular intervals in the width direction in a space of 1 mm or more.

6. The superconducting wire according to claim 2, wherein a length of the cut portion is in a range of 100 to 200 mm, and a length of the uncut portion is in a range of 1 to 5 mm.

7. The superconducting wire according to claim 2, wherein, of the plurality of cuts, the uncut portions are formed in such a way as to lie next to each other in a same position in the width direction of the superconducting wire.

8. A superconducting conductor having a conductor structure comprising:
a cylindrical object; and
a superconducting wire comprising:
a superconducting thin film and a stabilizing film formed one on top of another in order on a substrate having a predetermined width and a predetermined length, having a plurality of cuts, which are parallel to each other and are made along a direction of a length thereof, wherein,
the superconducting wire being bent at the cuts in a width direction and disposed along an outer circumferential surface of the cylindrical object, and
the cut passes through all of the stabilizing film, the superconducting thin film, and the substrate.

9. The superconducting conductor according to claim 8, wherein,
the superconducting thin film is formed of an RE-based superconducting material,
the cuts are formed with a cut portion and an uncut portion, which are periodically regulated in the direction of the length, and
the plurality of cuts are made at regular intervals in the width direction so as to be parallel to each other.

10. The superconducting conductor according to claim 8, wherein the superconducting wire is bent at the cuts in the width direction along the outer circumferential surface of the cylindrical object.

11. The superconducting conductor according to claim 8, wherein,
the superconducting wire comprises a plurality of superconducting wires, and
the plurality of superconducting wires are disposed along the outer circumferential surface of the cylindrical object in the width direction so as to be adjacent to each other with a predetermined space left therebetween.

12. The superconducting conductor according to claim 11, wherein the predetermined space between the superconducting wires is less than 2 mm.

13. The superconducting conductor according to claim 11, further comprising:
at least one additional superconducting wire between the superconducting wires, the at least one superconducting wire being cut.

14. The superconducting conductor according to claim 13, wherein the additional superconducting wire has a same superconducting structure as the superconducting wire.

15. A superconducting cable comprising an electrical insulator layer, a protective layer, and a heat insulating tube around the superconducting conductor according to any one of claims 8 to 10 or 11 to 14.

* * * * *